United States Patent
Kaufmann et al.

(10) Patent No.: US 10,746,813 B2
(45) Date of Patent: Aug. 18, 2020

(54) TEST DEVICE AND METHOD FOR OPERATING A TEST DEVICE

(71) Applicant: OMICRON Electronics GmbH, Klaus (AT)

(72) Inventors: Reinhard Kaufmann, Thüringerberg (AT); Dirk Flax, Dornbirn (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 101 days.

(21) Appl. No.: 15/563,221

(22) PCT Filed: May 20, 2016

(86) PCT No.: PCT/EP2016/061401
§ 371 (c)(1),
(2) Date: Sep. 29, 2017

(87) PCT Pub. No.: WO2016/202523
PCT Pub. Date: Dec. 22, 2016

(65) Prior Publication Data
US 2018/0088165 A1    Mar. 29, 2018

(30) Foreign Application Priority Data

Jun. 17, 2015 (AT) .............. A 50503/2015

(51) Int. Cl.
*G01R 31/72* (2020.01)
*G01R 31/62* (2020.01)
*H02P 13/00* (2006.01)

(52) U.S. Cl.
CPC ............. *G01R 31/72* (2020.01); *G01R 31/62* (2020.01); *H02P 13/00* (2013.01)

(58) Field of Classification Search
CPC ...... G01R 31/027; G01R 31/06; G01R 31/62; G01R 31/72; H02P 13/00
USPC .................................................. 324/546, 547
See application file for complete search history.

(56) References Cited

U.S. PATENT DOCUMENTS

| | | | | |
|---|---|---|---|---|
| 4,739,248 A | * | 4/1988 | Perkins | G01R 31/2829 324/726 |
| 4,857,827 A | * | 8/1989 | Zoltan | G01R 35/02 324/726 |
| 5,172,067 A | | 12/1992 | Hoffman | |
| 5,225,789 A | | 7/1993 | Caine et al. | |
| 5,233,305 A | | 8/1993 | Nishizawa et al. | |

(Continued)

FOREIGN PATENT DOCUMENTS

| CN | 102684508 A | 9/2012 |
|---|---|---|
| CN | 102742135 A | 10/2012 |

(Continued)

OTHER PUBLICATIONS

Tap Changer Analyzer & Winding Ohmmeter RMO40TD, RMO40TD Brochure.

(Continued)

*Primary Examiner* — Jeff W Natalini
(74) *Attorney, Agent, or Firm* — Preti Flaherty Beliveau & Pachios LLP

(57) ABSTRACT

A test device is configured for testing a specimen which has an inductor. The test device includes a controllable unit for reducing a current intensity of a current flowing in the inductor.

30 Claims, 7 Drawing Sheets

(56) References Cited

U.S. PATENT DOCUMENTS

| | | | |
|---|---|---|---|
| 7,126,344 B2* | 10/2006 | Rocher | B60R 25/20 324/546 |
| 8,487,592 B2 | 7/2013 | Koeppl et al. | |
| 8,513,939 B2 | 8/2013 | Hanawa et al. | |
| 9,059,584 B2 | 6/2015 | Spannhake et al. | |
| 2002/0057091 A1 | 5/2002 | Hensler et al. | |
| 2006/0055419 A1* | 3/2006 | Paulson | G01R 31/343 324/765.01 |
| 2009/0102484 A1* | 4/2009 | DeVries | G01R 33/3403 324/322 |
| 2009/0153093 A1* | 6/2009 | Pinewski | H02P 8/36 318/696 |
| 2010/0231284 A1* | 9/2010 | Jacobson | H02H 9/08 327/307 |
| 2011/0298430 A1 | 12/2011 | Gaona et al. | |
| 2013/0307511 A1* | 11/2013 | De Vries | G01R 19/0092 323/284 |
| 2013/0307558 A1 | 11/2013 | Klapper | |

FOREIGN PATENT DOCUMENTS

| | | |
|---|---|---|
| DE | 102010001626 A1 | 8/2011 |
| DE | 102011002674 A1 | 8/2011 |
| EP | 2400654 B1 | 5/2017 |
| RU | 2066868 C1 | 9/1996 |
| RU | 2467464 C1 | 11/2012 |
| RU | 136186 U1 | 12/2012 |
| SU | 1599815 A1 | 10/1990 |

OTHER PUBLICATIONS

Russian Search Report, completed on Oct. 19, 2018, for related Russian Patent Application No. 2017/132431, international filing date May 20, 2016. English translation.

Zhukov, A. and Popov, M., Electricity recovery during testing, Solutions and equipment, Testpribor, Sep. 24, 2014, http://www.test-expert.ru/news/detail.php?ID=794, found on the Internet Oct. 17, 2018, paragraphs 1, 3 and drawing.

Kepco'S Bop Family of Four Quadrant Bipolar Power Supplies, Kepco, an ISO 9001 Company, The Power Supplier Since 1946, (2011), pp. 1-8, www.kepcopower.com.

Chinese Search Report, dated Apr. 15, 2019, from related application CN2016/800215161, filed on May 20, 2016. Chinese with Roman character references.

\* cited by examiner

TEST DEVICE AND METHOD FOR OPERATING A TEST DEVICE

FIELD OF THE INVENTION

Exemplary embodiments of the invention relate to a test device for testing energy-related units, for example a transformer, and to methods for operating such test devices. Exemplary embodiments of the invention relate, in particular, to such devices and methods, with the aid of which at least one characteristic quantity of a transformer can be ascertained.

BACKGROUND

Transformers are utilized as components of power supply networks. Transformers can be utilized for converting voltage from a first value at a high-voltage side to a second value, which is lower than the first value, at a low-voltage side.

The determination of properties of a transformer by means of a test in which one or multiple characteristic variables of the transformer are ascertained via measurement is required, for example, in order to ensure the operating safety, for the purpose of actuation, or for other reasons. Examples of such measurements include the determination of a static resistance, a transformation ratio, a leakage inductance or leakage reactance. Test devices for units used in power engineering can be designed not only for transformers but also for testing other units such as protective switches or protective relays.

Test devices can be configured for testing energy-related units such as transformers or converters that comprise an inductor. For example, such test devices can be configured for testing a transformer that includes an inductor in which energy is temporarily stored.

In different operating situations during a test of a test specimen, it can be desirable to reduce the energy stored in the inductor, for example to dissipate the energy. Examples of such operating situations include the end of a test of a test specimen or the end of a test step of a test procedure including several steps. Further examples include emergency shutoffs of the test device in the event of a fault.

One or multiple resistors can be utilized, for example, for reducing the energy stored in the inductor of the test specimen. Such techniques have the disadvantage, however, that the reduction of the energy stored in the coil can still take a relatively long time. This can be undesirable for different reasons. For example, it can be desirable for reasons of safety to reduce the energy stored in the inductor relatively rapidly.

SUMMARY OF THE INVENTION

There is a demand for devices and methods with the aid of which a current intensity of a current flowing in an inductor of a test specimen can be reduced. There is a demand, in particular, for devices and methods of the type that can be utilized for rapidly reducing the current intensity of the current in the inductor of the test specimen and that can be implemented in a simple and compact way.

According to exemplary embodiments, it is provided not to reduce a current intensity of a current flowing in an inductor using purely passive elements, but rather to actively reduce this by means of a controllable unit. The controllable unit can be controllable in such a way that electrical energy can flow not only from the test device to the test specimen, but also from the inductor of the test specimen back into the test device in order to reduce a current intensity of a current in the inductor. The controllable unit can be controllable in such a way that current flow and voltage in the controllable unit are oriented in opposite directions, and so the controllable unit dissipates energy when it is controlled in such a way that current flow and voltage in the controllable unit are oriented in opposite directions.

The controllable unit can be a four-quadrant amplifier or can include such an amplifier. The four-quadrant amplifier can be controllable in such a way that current flow and voltage in the controllable unit are oriented in the same direction in order to thereby store energy in the inductor, and can also be controllable in such a way that current flow and voltage in the controllable unit are oriented in opposite directions, and so energy is dissipated in order to reduce the current flowing in the inductor.

Alternatively or additionally, the controllable unit can include a bi-directional DC/DC converter so that energy that flows from the inductor of the test specimen back into the test device can be returned to the network.

The inductor can be a coil or another inductor of a transformer or converter, to which the test device can be connected for a test.

Due to the use of such a controllable unit, the time required for reducing the current intensity can be shortened. The amount of time required for testing the test specimen can be shortened and/or a more rapid shutoff in the event of a fault is made possible.

The controllable unit can be configured for dissipating the energy flowing from the inductor back into the test device in the test device itself, for example via conversion into heat. For this purpose, the controllable unit can include a four-quadrant amplifier.

The controllable unit can be configured for feeding the energy flowing from the inductor back into the test device into a network, via the test device. For this purpose, the controllable unit can include a bi-directional converter in order to feed the power flowing from the test specimen back into the test device back into the network via the test device.

The actuation of the controllable unit in order to reduce the current intensity of the current flowing in the inductor can be carried out as a safety function, for example in response to an actuation of an emergency shutoff switch. The actuation of the controllable unit in order to reduce the current intensity of the current flowing in the inductor can be carried out between different test steps of a test procedure in order to shorten the overall time required for the test. The actuation of the controllable unit in order to reduce the current intensity of the current flowing in the inductor can take place, alternatively or additionally, in the event of a fault in which the energy stored in the inductor of the test specimen is to be rapidly reduced.

The test device comprises a controllable unit for reducing a current intensity of a current flowing in the inductor of the test specimen.

The controllable unit can be configured for generating a time-varying countervoltage in order to reduce the current intensity. In this way, the current intensity can be efficiently reduced. The countervoltage can be adjusted as a function of time according to a predefined open-loop or closed-loop control function.

The test device can include a controller for controlling the controllable unit according to a detected voltage and/or a detected current.

The controller can be configured for adjusting the countervoltage, which is generated by the controllable unit, in a closed loop.

The controller can be configured for a power regulation in which the power dissipated in the controllable unit is regulated to a setpoint power value. In an operating phase in which the current intensity of the inductor of the test specimen is not to be actively reduced, the controllable unit can be actuated in such a way that the current intensity is regulated.

The controller can be configured to switch from a further closed loop to the closed loop when the current intensity in the inductor is to be reduced. The further closed loop, which is carried out in an operating phase in which the current intensity is not to be reduced, can include a current intensity regulation of the current flowing in the inductor.

The controllable unit can be configured for generating the countervoltage in such a way that an absolute value of the countervoltage increases monotonously during a time interval.

The test device can be configured for feeding energy to the inductor, via the controllable unit, in order to generate a current flowing in the inductor and for dissipating energy stored in the inductor, via the controllable unit, in order to reduce the current intensity. In this way, the number of required components can be reduced, since the same unit can be utilized both for storing energy and for discharging the inductor. Energy can be stored in the inductor, for example when a test signal is applied at the test specimen.

The controllable unit can include an amplifier. The amplifier can be a power amplifier. The amplifier can be a semiconductor amplifier.

The amplifier can be a four-quadrant amplifier. The four-quadrant amplifier can be controlled in such a way that current intensity and voltage can also be oppositely oriented.

The test device can be designed as a transformer test device or as a converter test device. The transformer test device or the converter test device can be mobile, for example portable.

A system according to one exemplary embodiment includes a test specimen which comprises an inductor, and a test device according to one exemplary embodiment, which is connected to the test specimen. The test specimen can be a transformer or a converter.

The transformer can be a two-winding transformer or a three-winding transformer.

The transformer or converter can be installed in a power plant, a transformer substation, or another system for energy generation and/or energy transmission. The transformer can be a transformer for a high-voltage network or a medium-voltage network.

In a method according to one exemplary embodiment, a test device is controlled in order to test a test specimen that includes an inductor. The method includes an actuation of a controllable unit of the test device in order to reduce a current intensity of a current flowing in the inductor.

In the method, the controllable unit can be actuated in such a way that it generates a time-varying countervoltage in order to reduce the current intensity. In this way, the current intensity can be efficiently reduced. The countervoltage can be adjusted as a function of time according to a predefined open-loop or closed-loop control function.

In the method, the controllable unit can dissipate the energy flowing from the inductor back into the test device in the test device itself, for example via conversion into heat.

In the method, the controllable unit can feed the energy flowing from the inductor back into the test device into a network, via the test device.

In the method, the controllable unit can be actuated according to a detected voltage and/or a detected current, for example according to an output current of the test device, according to an output voltage of the test device, and/or according to an intermediate circuit voltage of the test device.

In the method, the countervoltage generated by the controllable unit can be adjusted in a closed loop. Alternatively or additionally, the controllable unit can be controlled in such a way that the power dissipated in the test device by the controllable unit and/or the power fed from the test device back into a network is regulated to a setpoint value.

In the method, the controllable unit can be actuated in a first way in order to apply or inject a test signal onto or into the test specimen. The controllable unit can be actuated in a second way when energy that is stored in the inductor of the test specimen is to be dissipated in the test device itself or by being fed back into the network via the test device. The actuation of the controllable unit in order to reduce the current flowing in the inductor of the test specimen can take place in a closed loop in which, for example, the power dissipated by the controllable unit is regulated to a setpoint power value. The actuation of the controllable unit for applying or injecting a test signal can take place in such a way that, for example, the output current or an amplitude of the output current of the test device is regulated to a setpoint current value.

In the method, the countervoltage can be generated in such a way that an absolute value of the countervoltage increases monotonously during a time interval.

In the method, the controllable unit, for example a four-quadrant amplifier, can be actuated in such a way that a power dissipated in the test device by the controllable unit is regulated to a setpoint value, while the current intensity of the current flowing in the inductor is reduced. A sufficient dissipation of heat by the four-quadrant amplifier can be ensured in this way.

In the method, the countervoltage can be generated in such a way that the absolute value of the countervoltage increases for as long as an intermediate circuit voltage of the test device is constant. In this way, the controllable unit can be utilized, in particular, for reducing the current intensity in the inductor of a converter of the test device.

In the method, energy can be supplied via the controllable unit in order to inject a test signal into the test specimen, which results in a current flow in the inductor, and energy stored in the inductor can be dissipated via the controllable unit in order to reduce the current intensity. In this way, the number of required components can be reduced, since the same device can be utilized both for storing energy and for discharging the inductor.

The controllable unit can include an amplifier. The amplifier can be a power amplifier. The amplifier can be a semiconductor amplifier.

The amplifier can be a four-quadrant amplifier. The four-quadrant amplifier can be controlled in such a way that current intensity and voltage can also be oppositely oriented.

The test device that is controlled with the aid of the method can be designed as a transformer test device or a converter test device. The transformer test device or the converter test device can be mobile, for example portable.

In the method, the test device can be connected to a transformer or a converter.

The transformer can be a two-winding transformer or a three-winding transformer.

The transformer or converter can be installed in a power plant, a transformer substation, or another system for energy generation and/or energy transmission. The transformer can be a transformer for a high-voltage network or a medium-voltage network.

Devices, methods, and systems according to exemplary embodiments allow for an efficient reduction of the energy stored in a coil or another inductor, for example in the event of an emergency shutoff. Alternatively or additionally, the energy stored in the inductor can also be reduced via the controllable unit when, for example, a test step of a test procedure has been completed.

BRIEF DESCRIPTION OF THE FIGURES

The invention is described in greater detail in the following on the basis of the drawings, with reference to preferred embodiments. In the drawings, identical reference signs designate identical elements.

DETAILED DESCRIPTION OF EXEMPLARY EMBODIMENTS

Figure 1:
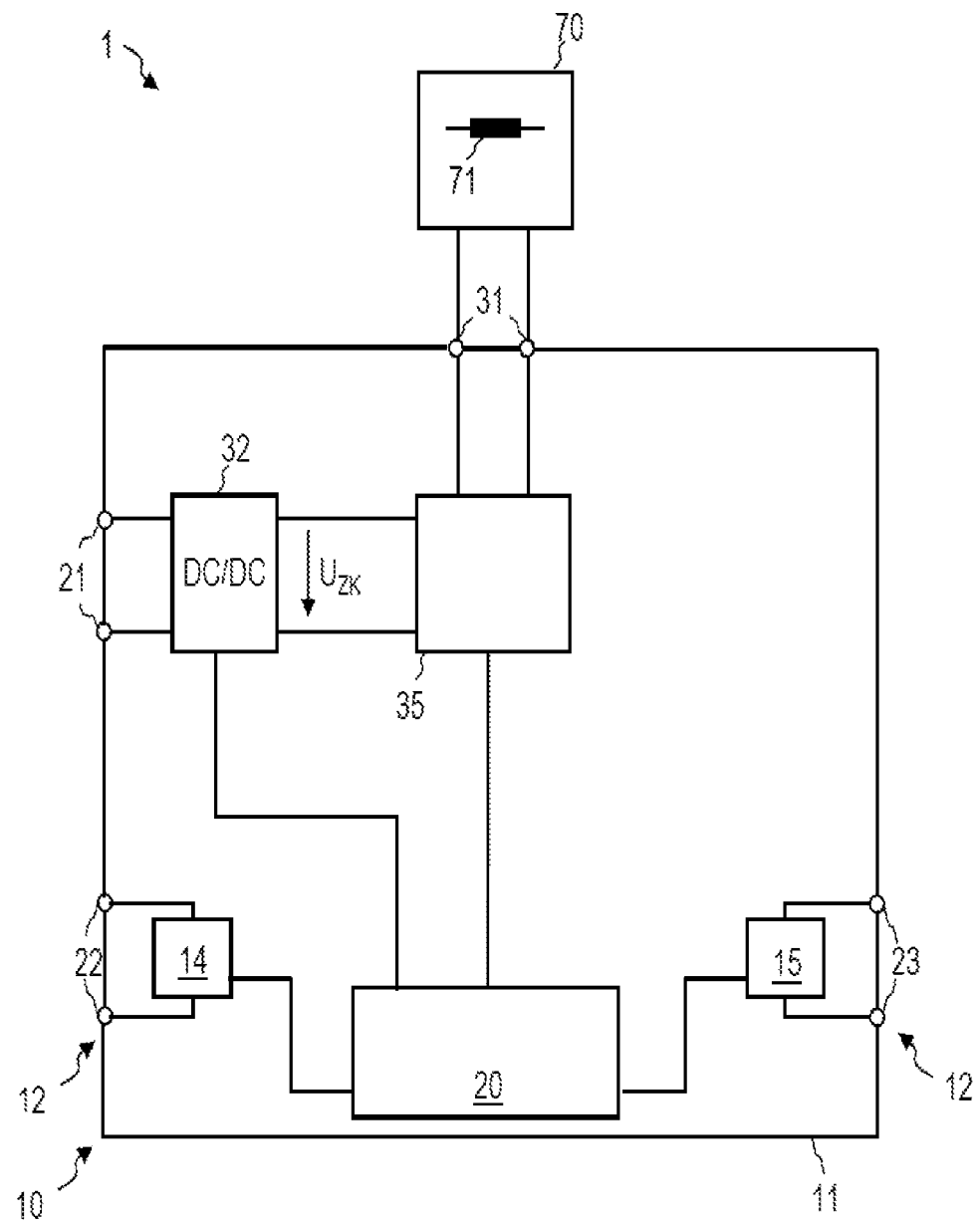
FIG. 1 shows a test device according to one exemplary embodiment.

The present invention is described in greater detail in the following on the basis of the drawings, with reference to preferred embodiments. In the figures, identical reference numbers designate elements that are identical or similar. The figures are schematic representations of different embodiments of the invention. Elements represented in the figures are not necessarily shown to scale. Instead, the different elements represented in the figures are depicted in such a way that their function and their purpose become understandable to a person skilled in the art.

Connections and couplings between functional units and elements, which are represented in the figures, can also be implemented as an indirect connection or coupling. A connection or coupling can be implemented in a wired or wireless manner.

Test devices and methods for testing a test specimen are described in detail in the following. The test specimen can be a transformer or a converter for high-voltage networks or medium-voltage networks. The test specimen can be a transformer installed in a power plant or a transformer substation. The test devices can be a mobile device or can be formed from multiple mobile devices in order to enable the measurements to be carried out on the installed transformer. The test specimen comprises an inductor which can be a coil or a conductor rail.

The test device comprises a controllable unit which is actuated in order to reduce energy stored in the inductor of the test specimen. The controllable unit can be a four-quadrant amplifier. For the purpose of reducing energy stored in the inductor, the controllable unit can be actuated in such a way that current and voltage in the controllable unit are oppositely oriented, and so energy flows back into the test device and is dissipated in the controllable unit. In this operating state, the controllable unit is operated in quadrant II or IV of the U-I diagram. Alternatively or additionally to a dissipation, in which the return-flowing energy is converted into heat in the test device, at least a portion of the energy flowing back can be fed from the test device back into the network.

The inductor can be a coil of a test specimen, in particular a coil of a transformer of an energy-related installation.

A reduction of the current intensity of a current flowing in the inductor can take place, for example, when an emergency shutoff switch of the test device is actuated. The controllable unit, e.g., the four-quadrant amplifier, can then be actuated in such a way that it generates a time-varying countervoltage to a voltage that is dropping across the inductor, in order to reduce the current intensity.

The test devices and methods can be configured for automatically determining different characteristic quantities of the transformer or another test specimen. For example, one or multiple transformation ratios of the transformer can be automatically determined without the need to perform rewiring for this purpose. Other characteristic quantities such as static or dynamic resistances or a leakage reactance and/or a leakage inductance of the transformer can also be ascertained. A test response, which is detected in response to a test signal, can be evaluated by the test device for this purpose. The test signal can be generated by the controllable unit of the test device and can be output to the test specimen. The reduction of the current intensity of the current flowing in the inductor can take place under the control of a controller of the test device, for example when an emergency shutoff switch has been actuated.

FIG. 1 shows a system 1 which includes a test device 10 for ascertaining a characteristic quantity of a test specimen according to one exemplary embodiment. An output terminal 31 of the test device 10 is conductively connected to a test specimen 70. The test device 10 can be connectable to the test specimen 70 in a non-destructively detachable way in order to apply or inject a test signal to or into the test specimen 70 and in order to detect a test response of the test specimen 70. The test specimen 70 can be a transformer. The test specimen 70 includes at least one inductor 71 which can be designed as a coil, a winding, or a conductor rail.

The test device 10 can be designed as a single device comprising a housing 11, as represented in FIG. 1. The test device 10 can consist of an arrangement of multiple devices or units. In this case, the multiple devices or units can be controlled by one central controller. The test device 10 can be a transformer test device. The transformer test device 10 can be designed as a mobile device and, in particular, as a portable device.

The test device 10 includes a plurality of terminals 12 for connection to the test specimen, a converter 32 and a controller 20. The test device 10 is configured for generating a test signal for the test specimen and evaluating a test response of the test specimen. One or multiple measuring units 14, 15 for detecting the test response of the test specimen can be integrated into the test device 10. One or multiple controllable switching means can be integrated into the test device 10, for example in order to selectively short circuit a primary side or a secondary side of the test specimen during the test. The at least one measuring unit 14, 15 and one controller 20 can be installed in a housing 11 of the transformer test device.

The converter 32 can be configured for generating an intermediate circuit voltage. Such a direct-current intermediate circuit makes it possible to generate reactive power in the device. A lower current draw from a power receptacle can be achieved, since only active power is withdrawn. Alternatively or additionally, longer feed-in times are possible. The converter 32 can be a bidirectional DC/DC converter.

The intermediate circuit voltage of the converter can feed a controllable unit 35 which is described in greater detail in the following. The controllable unit 35 can be a four-quadrant amplifier.

The converter 32 can be coupled on the input side to a terminal 21 for connection to an external energy source, for example a power receptacle. The converter 32 can be coupled on the input side to a battery or to another energy accumulator. The battery or the other energy accumulator can be integrated in the housing 11 of the test device 10.

The converter 32 can include at least one controllable switch. The at least one controllable switch can be a switch of a full-bridge or a half-bridge. The at least one controllable switch can be switched in a clocked manner.

During the operation of the test device 10, a test signal can be injected into the test specimen 70 or can be applied at the test specimen 70. A test response can be detected via terminals 22, 23 which can be connected to the test specimen and which are connected to at least one measuring unit 14, 15.

The controller 20 can be configured for ascertaining characteristic quantities of the test specimen depending on the test response of the test specimen to the test signal.

The controller 20 can be configured for ascertaining characteristic quantities of the test specimen depending on the test response of the test specimen to the test signal. The controller 20 can include one or multiple integrated semiconductor circuits, for example an application-specific, special purpose circuit (ASIC, "application specific integrated circuit"), a controller, a microcontroller, a processor, a microprocessor, or a combination thereof. The controller 20 can control the converter 32, the controllable unit 35 and, optionally, further units of the test device 10, such as, for example, a switching matrix, depending on an actuation of a user interface of the test device 10.

In different operating states, for example after actuation of an emergency shutoff button, it can be desirable to rapidly reduce this energy. The operating safety can be increased as a result. Alternatively or additionally, it can be desirable to rapidly decrease the energy stored in the inductor 71 between different test steps of a test procedure comprising multiple test steps. The overall time required for the test of the test specimen can be reduced as a result.

A controllable unit 35 can be provided for reducing the energy stored in the inductor 71. The controllable unit 35 can be actuatable in order to generate a countervoltage to the voltage dropping across the inductor 71. The controllable unit 35 can be actuated by the controller 20 of the test device 10 at least when the energy stored in the inductor 71 is to be reduced. This can be the case, for example, after actuation of an emergency shutoff switch. The controllable unit 35 can be controlled by the controller 20 according to different control loops depending on whether there is a normal operation, in which energy flows from the test device 10 to the test specimen 70, or an emergency operation, in which energy flows from the test device 10 to the test specimen 70, or an emergency operating mode, in which the energy stored in the inductor 71 is to be reduced. For example, when the energy stored in the inductor 71 is to be rapidly reduced, a closed-loop control to the intermediate circuit voltage or a power regulation can take place.

The controllable unit 35 can be actuated in a control loop, although this is not required. For example, the controllable unit 35 can be actuated in such a way that, when energy flows from the test specimen 70 back into the test device 10, the return-flowing power and/or the power dissipated in the controllable unit 35 is regulated to a setpoint power value.

The controllable unit 35 can be configured for generating a countervoltage to the voltage across the inductor 71 in order to reduce the energy stored in the inductor 71. The countervoltage can have a monotonously increasing absolute value during at least one part of the time period in which the energy stored in the inductor 71 is to be reduced. The controllable unit 35 can be actuated by the controller 20 in such a way that the absolute value of the countervoltage—which is generated in order to reduce the energy stored in the inductor 71—increases for as long as the intermediate circuit voltage at the output terminal of the converter 32 is constant.

The controllable unit 35 can have different configurations. The controllable unit 35 can be—although is not required to be—designed as an amplifier which is actuated during an energy flow from the test device 10 to the test specimen 70 and in order to reduce the energy stored in the inductor 71. In further embodiments, the controllable unit 35, which is actuated in order to reduce the current intensity of the current flowing in the inductor, for example during an emergency shutoff operation, does not also have to be actuated in order to store energy in the inductor 71. For example, different amplifiers can be utilized for charging and discharging the inductor 71.

Figure 2:
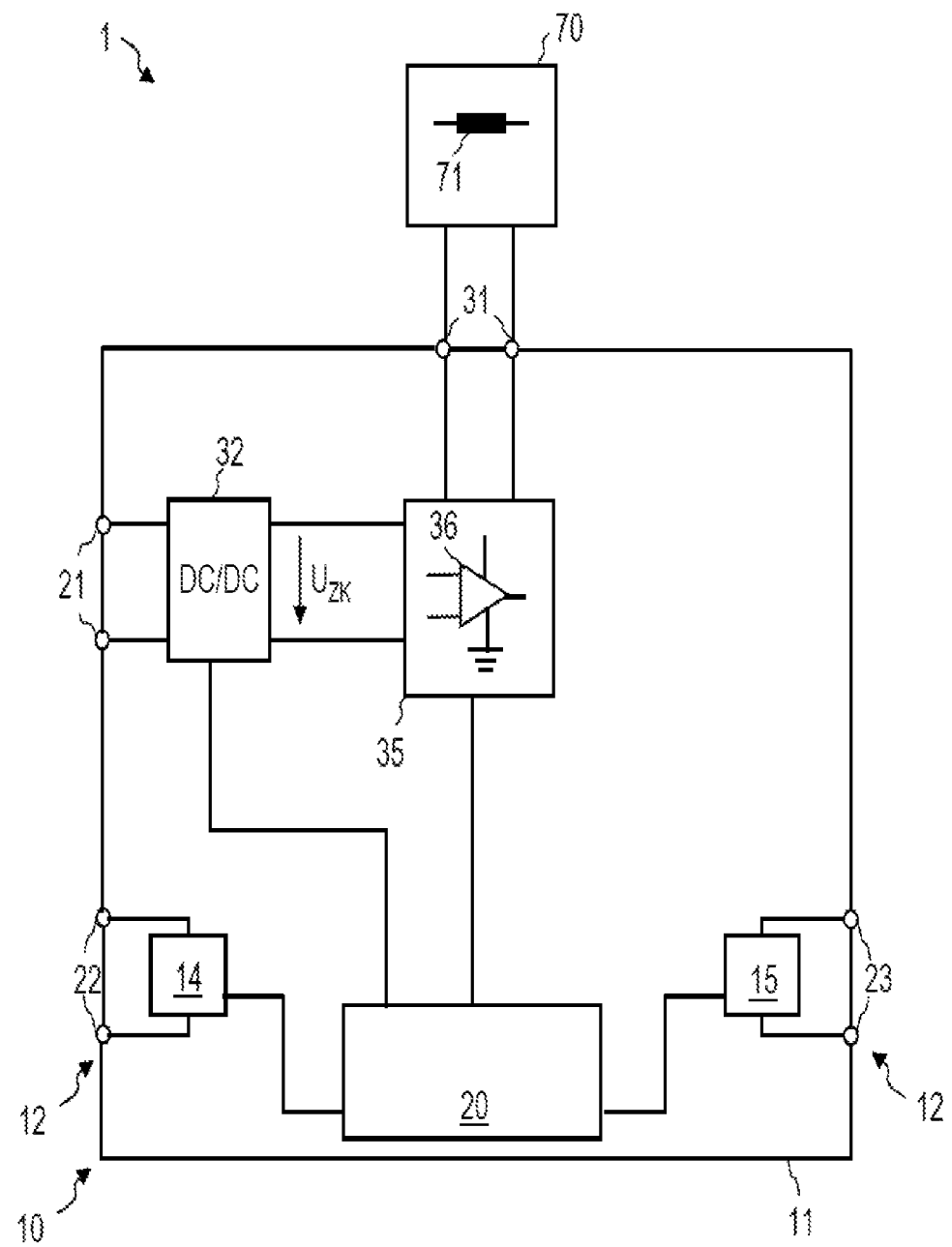
FIG. 2 shows a test device according to one exemplary embodiment.

FIG. 2 shows a system 1 comprising a test device 10 for ascertaining a characteristic quantity of a test specimen 70 according to one exemplary embodiment. Units that can correspond in terms of function or configuration to units described with reference to FIG. 1 are designated using the same reference numbers.

The controllable unit 35, with the aid of which a countervoltage to the voltage across the inductor 71 is generated in order to reduce energy stored in the inductor 71, can include an amplifier 36 or can be designed as an amplifier 36. The amplifier 36 can be a four-quadrant amplifier. The amplifier 36 can be configured for increasing the current intensity of the current flowing in the inductor 71 in order to build up energy in the inductor 71. The amplifier 36 can be configured for decreasing the current intensity of the current flowing in the inductor 71 in order to reduce energy in the inductor 71. For this purpose, the amplifier 36 can generate a countervoltage—which can be time-varying—to the voltage over the inductor 71, as was described with reference to FIG. 1.

The amplifier 36 can be controlled differently by the controller 20 depending on whether an energy flow is to take place from the test device 10 to the test specimen 70 or whether energy is to be reduced in the inductor 71, and so the energy flow flows from the test specimen 70 across the terminal 31 to the test device 10. The amplifier 36 can be actuated by the controller 20 in such a way that current and voltage in the amplifier 36 are oriented in the same direction when an energy flow is to take place from the test device 10 to the test specimen 70. In this case, the amplifier 36 is operated in quadrant I or III of a U-I diagram. The amplifier 36 can be actuated by the controller 20 in such a way that current and voltage in the amplifier 36 are oriented in opposite directions when energy in the inductor 71 is to be reduced, and so the energy flow takes place from the test specimen 70 to the test device 10. In this case, the amplifier 36 is operated in quadrant II or IV of a U-I diagram. This can be the case, for example, when the controller 20 actuates the amplifier 36, after an actuation of an emergency shutoff switch, in order to discharge the inductor 71.

Figure 3:
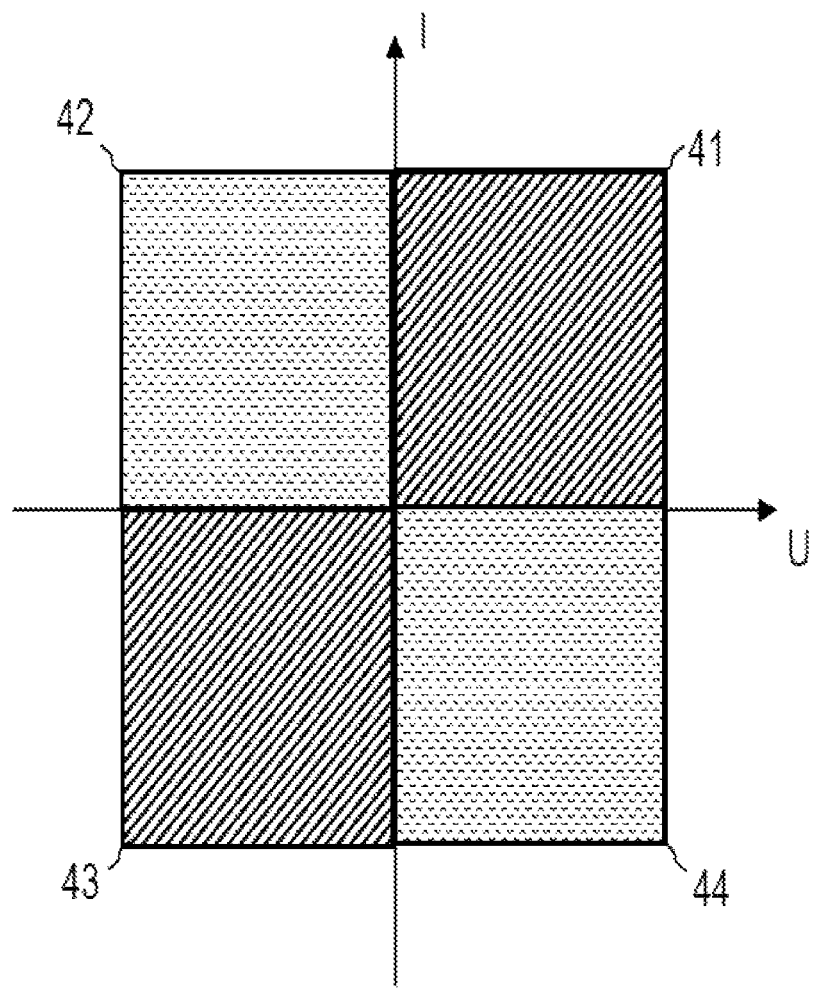
FIG. 3 is an illustration for describing the mode of operation of the test device according to one exemplary embodiment.

FIG. 3 shows, by way of example, a U-I diagram of an amplifier 36 for describing the mode of operation of the test device 10 according to one exemplary embodiment. The amplifier 36 can be contained in the test device 10 in order to discharge the inductor 71 and thereby dissipate energy stored in the inductor 71. In this case, the amplifier is actuated in such a way that current and voltage in the amplifier 36 are oriented in opposite directions. The amplifier 36 is operated in quadrant II 42 or in quadrant IV 44 of the U-I diagram.

The amplifier 36 can be configured for charging the inductor 71 and thereby building up energy stored in the inductor 71. In this case, the amplifier is actuated in such a way that current and voltage in the amplifier 36 are oriented in the same direction. The amplifier 36 is operated in quadrant I 41 or in quadrant III 43 of the U-I diagram.

Alternatively or additionally to a conversion of the energy flowing from the test specimen 70 back into the test device 10 into heat, at least a portion of the energy flowing back across the terminal 31 can be stored in an energy accumulator of the test device 10, for example a capacitor of the DC/DC converter 32, and/or can be fed back into the network via the DC/DC converter 32 and the terminal 21. For this purpose, the DC/DC converter 32 can be a bi-directional DC/DC converter 32.

Figure 4:
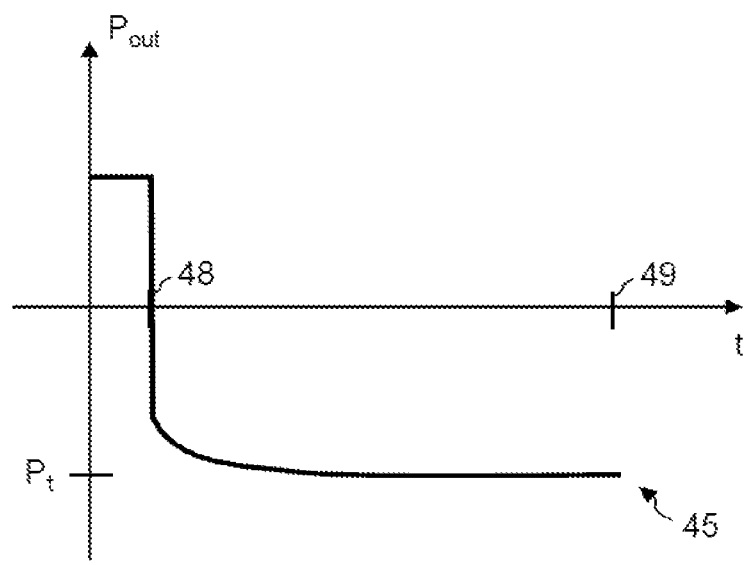
FIG. 4 is an illustration for describing the mode of operation of the test device according to one exemplary embodiment.

FIG. 4 shows a progression, by way of example, of an output power 45 at the terminal 31 that results when the amplifier 36 is actuated in order to reduce the current intensity of the current flowing in the inductor 71.

At a point in time 48, the controller 20 can detect that the current intensity of the current flowing in the inductor 71 is to be reduced, for example in order to demagnetize the inductor 71. The controller 20 can monitor a user interface of the test device 10 in order to detect whether an emergency shutoff switch has been actuated and, in response thereto, can initiate the reduction of the energy stored in the inductor 71. Alternatively or additionally, the controller 20 can control a progression of a test procedure of the test specimen and, depending on the progression, can initiate the reduction of the energy stored in the inductor 71.

The controllable unit 35 is actuated in such a way that the direction of the power flow at the terminal 31 reverses. The controllable unit 35 can be controlled according to a control loop in such a way that the power dissipated by the controllable unit 35 and/or the power flowing back from the test specimen 70 is regulated to a setpoint power value.

The absolute value of a countervoltage generated by the four-quadrant amplifier 36 can increase monotonously during a time interval. The absolute value of the countervoltage can be adjusted depending on the time derivative of the current in the inductor 71. The absolute value of the countervoltage can be adjusted by the controller 20 as a function of time.

The reduction of the current intensity in the inductor 71 can be terminated at a point in time 49. The controller 20 can terminate the process of reducing the energy stored in the inductor 71 depending on whether the intermediate circuit voltage is constant or whether the inductor 71 has been demagnetized.

During the operating state illustrated in FIG. 4, the amplifier 36 can be operated in such a way that current and voltage in the amplifier 36 are oriented in opposite directions, in order to dissipate, in the amplifier 36, energy stored in the coil. Alternatively or additionally, energy can be fed back into the network via the amplifier 36.

Figure 5:
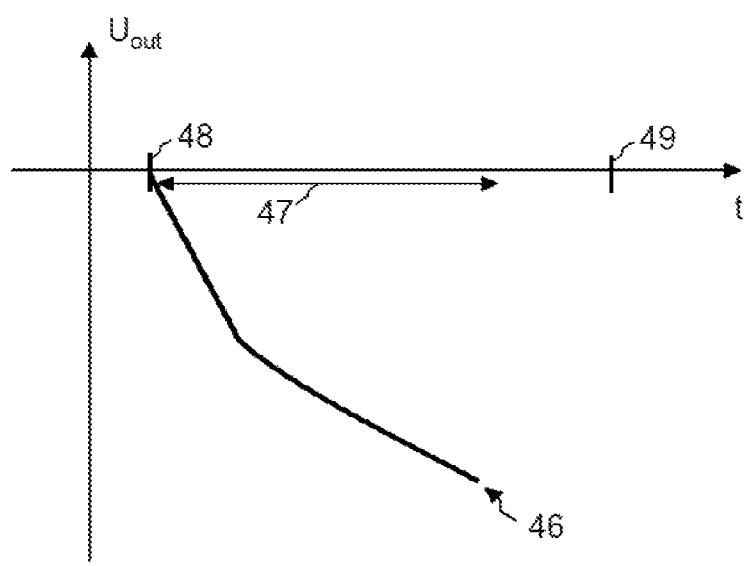
FIG. 5 is an illustration for describing the mode of operation of the test device according to one exemplary embodiment.

FIG. 5 shows a progression, by way of example, of an output voltage that results when the amplifier 36 is actuated in order to reduce the current intensity of the current flowing in the inductor 71.

The countervoltage 46 does not need to monotonously increase in the entire time period between the points in time 48, 49, in which the absolute value of the current intensity in the inductor is reduced. For example, the countervoltage 46 can also have a section in which it decreases. During a time interval 47, the absolute value of the countervoltage increases monotonously, while energy flows from the test specimen 70 to the test device 10.

Figure 6:
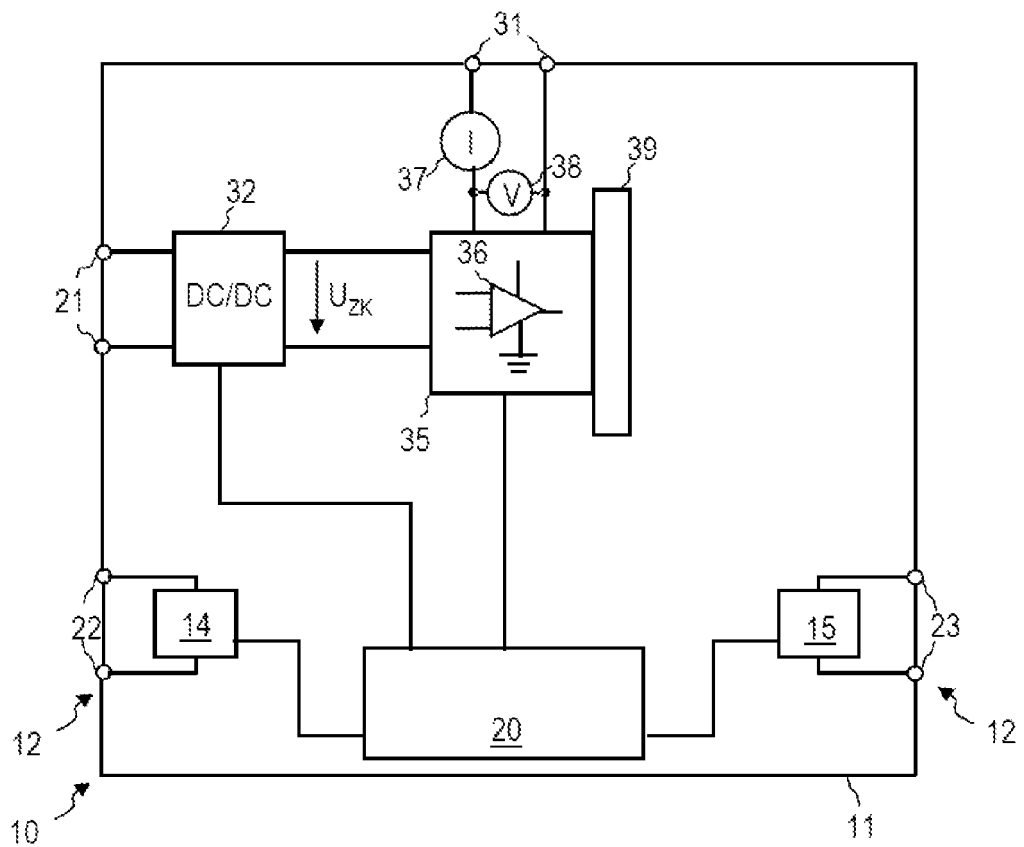
FIG. 6 shows a test device according to one exemplary embodiment.

FIG. 6 shows a test device 10 for ascertaining a characteristic quantity of a test specimen according to one exemplary embodiment. Units that can correspond in terms of function or configuration to units described with reference to FIG. 1 to FIG. 5 are designated using the same reference numbers.

The controllable unit 35, with the aid of which a countervoltage to the voltage across the inductor 71 is generated in order to reduce energy stored in the inductor 71, can be actuated depending on a current and/or a voltage detected by the test device 10. For example, a current intensity of the current flowing across the output terminal 31 can be detected with the aid of an ammeter 37 or another current-measuring unit. The voltage at the output terminal 31 can be detected with the aid of a voltmeter 38 or another voltage-measuring unit.

An absolute value of the countervoltage, which is generated by the controllable unit 35, can be adjusted at least in the operating state in which the controllable unit 35 is actuated in order to reduce the energy stored in the inductor 71, depending on the voltage detected by means of the voltage-measuring unit 38 and/or depending on the current intensity detected by means of the current-measuring unit 37.

The controller 20 can actuate the controllable unit 35, at least in the operating state in which the controllable unit 35 is actuated in order to reduce the energy stored in the inductor 71, in such a way that the power dissipated by the controllable unit 35 is adjusted in a control loop.

The controller 20 can actuate the controllable unit 35, at least in one further operating state in which the controllable unit 35 is actuated in such a way that energy flows from the test device 10 to the test specimen 70, in such a way that the countervoltage—which is generated by the controllable unit 35—to the voltage across the inductor 71 is adjusted as a manipulated variable in a control loop, by means of which an output current of the test device 10 is regulated.

The controller 20 can be configured in such a way that it automatically switches into a control loop which can be utilized specifically for reducing the energy stored in the inductor 71 when a result is detected that indicates that the energy stored in the inductor 71 is to be reduced. For example, during the generation of actuating signals for the amplifier 36, the controller 20 can switch from a further control loop, which can be a current-regulating loop, into a power-regulating loop when the test device switches from a normal operating state into an operating state in which the energy stored in the inductor 71 is actively reduced.

Figure 7:
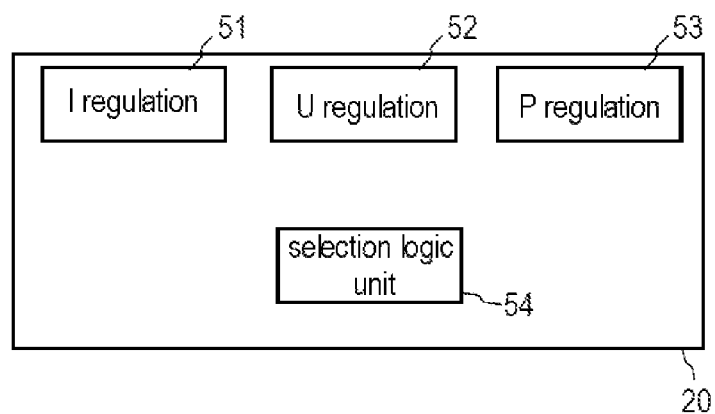
FIG. 7 is a block diagram of a controller of a test device according to one exemplary embodiment.

FIG. 7 shows a schematic block representation of a controller 20 of the test device 10. The controller 20 can be configured for carrying out a plurality of control loops.

The controller 20 can comprise one or multiple memory elements 51 for a first control loop. The first control loop can be a current-intensity regulator. The memory elements 51 for the first control loop can include a register, for example. Alternatively or additionally, the controller 20 can comprise one or multiple memory elements 52 for a second control loop. The second control loop can be a voltage regulator. The memory elements 52 for the second control loop can include a register, for example. Alternatively or additionally, the controller 20 can comprise one or multiple memory elements 53 for a third control loop. The third control loop can be a power regulator. The memory elements 53 for the third control loop can include a register, for example.

In one, multiple, or all control loops, at least one control signal for the amplifier 36 can be generated.

The controller 20 can include a selection logic unit 54. The selection logic unit 54 can include operations stored in a non-volatile manner, according to which the controller 20 selects one or multiple control loops for generating actuating signals. The selection logic unit 54 can be configured for selecting another control loop depending on whether the energy stored in the inductor 71 is to be reduced. The selection logic unit 54 can be configured for selecting—in response to the detection of an actuation of an emergency shutoff switch—a control loop which can be a power-regulating loop, in order to actuate the amplifier 36 in such a way that it generates a countervoltage to the voltage across the inductor 71.

Figure 8:
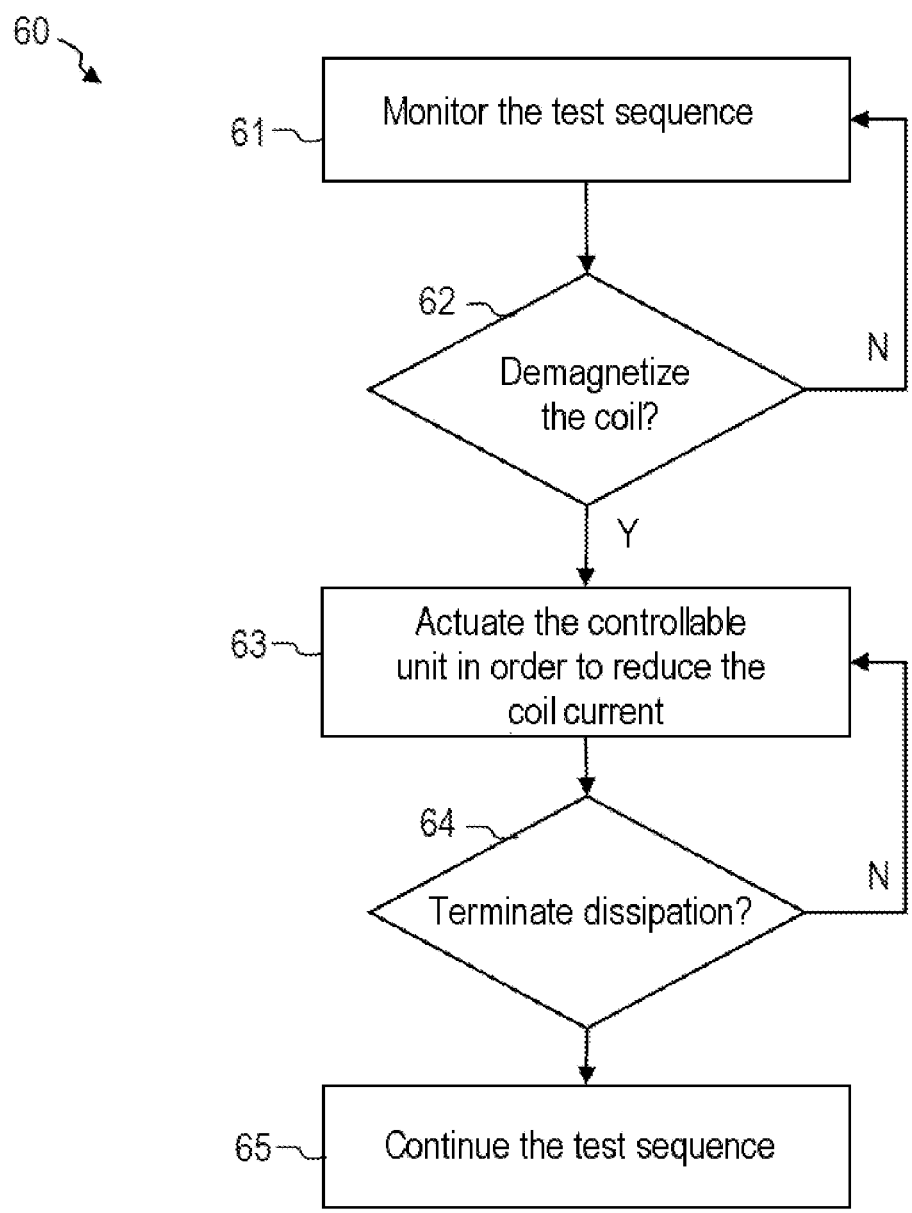
FIG. 8 is a flow chart of a method according to one exemplary embodiment.

FIG. 8 is a flow chart of a method 60. The method 60 can be automatically carried out by the test device 10 according to one exemplary embodiment.

In step 61, a test sequence can be monitored. For this purpose, the controller 20 can track which test signals are to be generated and/or which test responses are to be detected. The controller 20 can actuate the converter 32 and/or further controllable units of the test device 10 in order to generate the test signals. The controller 20 can detect, record and, optionally, evaluate test responses.

In step 62, a check is carried out to determine whether energy stored in the inductor 71 is to be reduced. The check in step 63 can be that the actuation of an emergency shutoff switch is to be monitored. Alternatively or additionally, monitoring can be carried out to determine whether a test step has been terminated, after which the energy stored in the inductor 71 is to be reduced. If the current intensity in the inductor 71 is not to be reduced, the method can return to step 61 in order to continue the test of the test specimen.

In step 63, if the current intensity in the inductor 71 is to be reduced, the controllable unit 35 can be actuated in such a way that it generates a time-varying countervoltage to the voltage across the inductor 71.

The controllable unit 35 can be actuated for generating a countervoltage to the voltage across the inductor 71 in order to reduce the energy stored in the inductor 71. The countervoltage can have a monotonously increasing absolute value during at least one part of the time period in which the energy stored in the inductor 71 is to be reduced. The controllable unit 35 can be actuated in such a way that the absolute value of the countervoltage—which is generated in order to reduce the energy stored in the inductor 71—increases for as long as an intermediate circuit voltage of the test device 10 is constant. The controllable unit 35 can be actuated in such a way that a power dissipated in the four-quadrant diode 36 is regulated to a setpoint power value.

In step 64, a check can be carried out to determine whether energy stored in the inductor 71 has been sufficiently reduced. For this purpose, a check can be carried out to determine whether the current intensity of the current flowing in the inductor 71 has been reduced to a threshold current value and/or whether all the energy dissipated by the four-quadrant diode 36 or the energy fed back into the network via the test device 10 reaches a threshold energy value. If the energy stored in the inductor 71 has not been sufficiently reduced, the method can return to step 63.

In step 65, the test procedure can be continued. For this purpose, the controllable unit 35 can be actuated in such a way that an energy flow takes place from the test device 70 to the test specimen 10, and so energy in the inductor 71 is reduced again.

In step 65, a test response of the test specimen can be detected and evaluated. The test response can be processed further in order to ascertain one or multiple characteristic quantities of the test specimen.

The ascertained characteristic quantities can vary depending on the test specimen. For example, transformation ratios, reactances, short-circuit impedances, series resistances, or other characteristic quantities can be ascertained in a transformer test. In the test of a protective switch, it is possible to ascertain the current intensity at which the protective switch is triggered.

The method can return to step 61.

Figure 9:
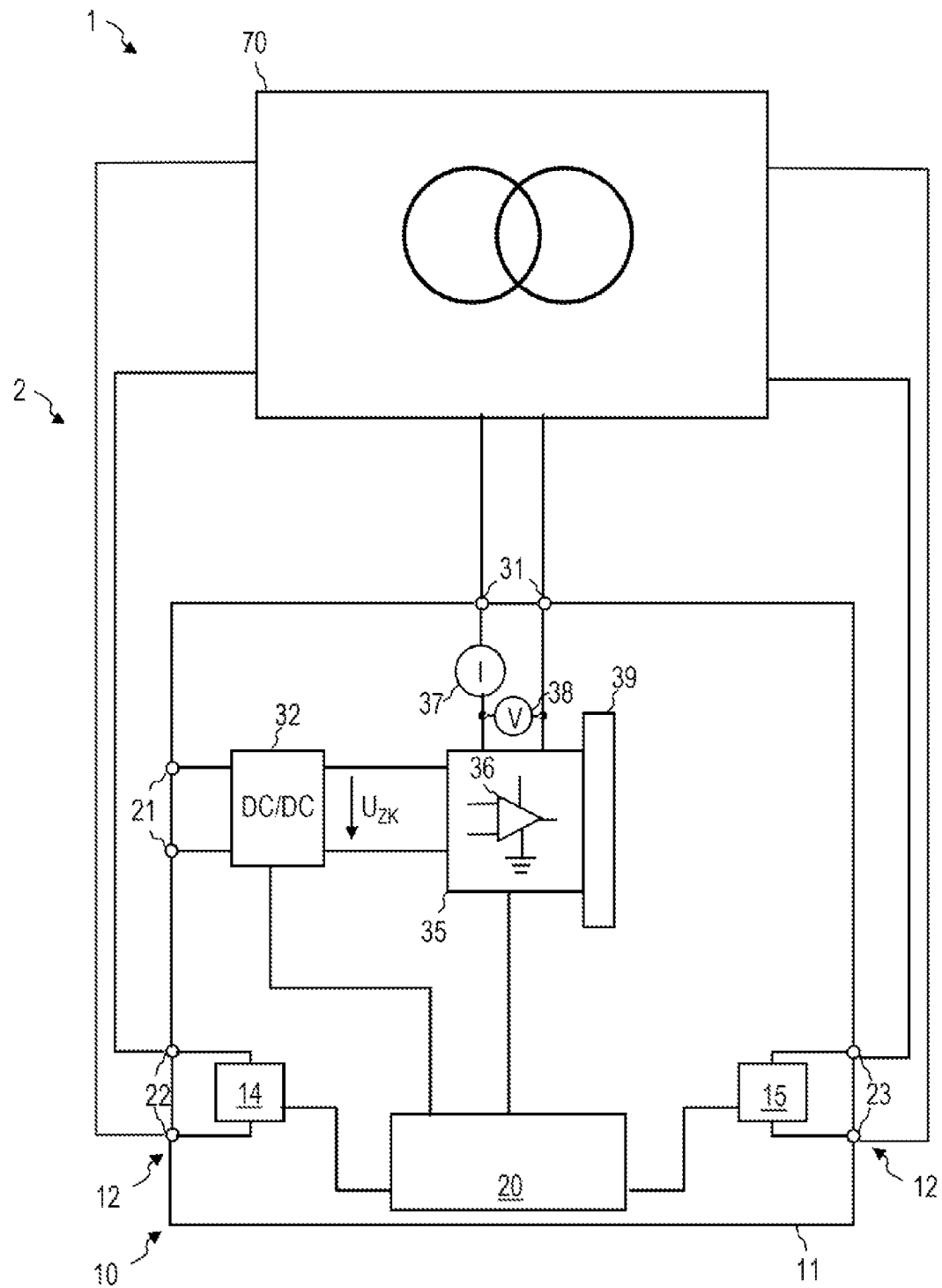
FIG. 9 shows a system comprising a transformer test device according to one exemplary embodiment.

FIG. 9 shows a system 1 comprising a test device 10 according to one exemplary embodiment.

The system 1 includes a test specimen 70 which can be a transformer. The test specimen 70 can be a two-winding transformer or a three-winding transformer.

The test device 10 can be designed as a transformer test device which can be portable. The test device 10 can be configured for automatically ascertaining one or multiple characteristic quantities of the test specimen 70. Examples of such characteristic quantities include a transformation ratio, a leakage reactance, and a series resistance. The test device 10 can have each of the embodiments described with reference to FIG. 1 to FIG. 8.

An energy stored in an inductor can be rapidly reduced with the aid of test devices and methods of the type described with reference to FIG. 1 to FIG. 9. For this purpose, a controllable unit can be utilized, which actively reduces the energy, for example by generating a countervoltage to the voltage dropping across the inductor 71.

While exemplary embodiments were described in detail with reference to the figures, alternative or additional features can be utilized in further exemplary embodiments. While, for example, certain measurements such as the determination of transformation ratios, resistances, leakage reactances and/or leakage inductances were described by way of example, other characteristic quantities of the test specimen can be determined, alternatively or additionally, by the test devices.

While the controllable unit of the test device in exemplary embodiments can be a power amplifier in the form of a four-quadrant amplifier, the designs described can also comprise other controllable units. For example, the controllable unit can include a bi-directional converter. In order to reduce the current intensity of the current flowing in the inductor, the energy flowing from the test specimen into the test device can be fed back, at least partially, into a network.

The device, methods and systems according to exemplary embodiments provide for a safe and reliable reduction of the energy stored in an inductor in the case of test devices for testing a test specimen, for example for a transformer test device.

The invention claimed is:

1. A test device for testing a test specimen of an energy-related unit, wherein energy is stored in an inductor of the test specimen during the test, wherein the test device includes:
   a controllable unit for reducing a current intensity of a current flowing in the inductor,
   wherein the controllable unit includes an amplifier; and
   a controller configured to actuate the controllable unit by generating at least one actuating signal for the amplifier,
   wherein the controller is configured to determine whether energy is to be reduced and, in response to said determining to automatically switch into a control loop when energy stored in the inductor is to be reduced, and to actuate the controllable unit,
   wherein the test device is configured to reduce energy stored in the inductor, via the amplifier of the controllable unit, in order to reduce the current intensity,
   wherein an energy flow flows from the test specimen into the test device,
   wherein, in response to the at least one actuating signal, the amplifier is controlled so that current flow and voltage in the amplifier are oriented in opposite directions.

2. The test device as claimed in claim 1, wherein the controllable unit is configured for generating a time-varying countervoltage in order to reduce the current intensity.

3. The test device as claimed in claim 2, wherein the controller is configured for adjusting the countervoltage, which is generated by the controllable unit, in a closed loop.

4. The test device as claimed in claim 2, wherein the controllable unit is configured for generating the countervoltage in such a way that an absolute value of the countervoltage increases monotonously during a time interval.

5. The test device as claimed in claim 4, wherein the controllable unit is configured in such a way that the absolute value of the countervoltage increases for as long as an intermediate circuit voltage supplied to the controllable unit is constant.

6. The test device as claimed in claim 1, wherein the controller is configured for controlling the controllable unit in a control loop in order to regulate a power dissipated by the controllable unit.

7. The test device as claimed in claim 1, wherein the test device is configured for feeding energy, via the controllable unit, in order to store energy in the inductor and for dissipating energy stored in the inductor, via the controllable unit, in order to reduce the current intensity.

8. The test device as claimed in claim 1, wherein the controllable unit includes a four-quadrant amplifier.

9. The test device as claimed in claim 1, which is designed as a transformer test device or as a converter test device.

10. A system, including:
    a test specimen which includes an inductor; and
    a test device as claimed in claim 1, which is connected to the test specimen in order to reduce a current intensity of a current flowing in the inductor.

11. The test device as claimed in claim 1, wherein the controller is configured for carrying out a plurality of control loops.

12. The test device as claimed in claim 1, wherein the controller is configured for storing energy in the inductor in a further control loop and to actuate the controllable unit so that energy flows from the test device to the test specimen.

13. The test device as claimed in claim 1, wherein the test device is configured for generating a test signal for the test specimen and evaluating a test response of the test specimen, and
    wherein the controller is configured to actuate the controllable unit to store energy in the inductor in response to the test signal.

14. The test device as claimed in claim 1, wherein the test device further includes a terminal that is conductively connectable to the test specimen in a non-destructively detachable way, and
    wherein the energy flows from the test specimen across the terminal to the test device.

15. The test device as claimed in claim 1, wherein the controllable unit includes a bi-directional converter.

16. The test device as claimed in claim 1, wherein the controllable unit is configured to switch into a plurality of control loops, the plurality of control loops including the control loop when energy stored in the inductor is to be reduced, and
    wherein the controller comprises at least one memory element for each control loop in the plurality of control loops.

17. The test device as claimed in claim 16, wherein the controller is configured to reduce the energy to carry out at least one control loop as a power regulator based at least in part on the at least one memory element.

18. The test device as claimed in claim 16, wherein the controller comprising a selection logic unit configured to select a control loop from the plurality of control loops based at least in part on the determining whether energy is to be reduced.

19. The test device as claimed in claim 1, wherein the controller is further configured to, when determining whether energy is to be reduced, at least one of:
    detect whether an emergency shutoff switch has been actuated;
    monitor a user interface of the test device;
    detect that the inductor is to be demagnetized; and
    monitor a progress of a test procedure.

20. A method for controlling a test device, wherein the test device is configured for testing a test specimen, which includes an inductor for storing energy, wherein the method includes:
    determining, by a controller for a controllable unit of the test device, whether the energy stored in the inductor is to be reduced;
    in response to determining that the energy stored in the inductor is to be reduced, switching the controller into a control loop, generating at least one actuating signal for an amplifier in the controllable unit to actuate the controllable unit of the test device for reducing a current intensity of a current flowing in the inductor of the test specimen,
    wherein the test device is configured to reduce energy stored in the inductor, via the amplifier of the controllable unit, in order to reduce the current intensity and in such a way that current flow and voltage in the amplifier are oriented in opposite directions,
    wherein an energy flow flows from the test specimen into the test device.

21. The method as claimed in claim 20, which is automatically carried out by the test device.

22. The method as claimed in claim 20, wherein the controller is configured for carrying out a plurality of control loops.

23. The method as claimed in claim 20, wherein the controller is configured for storing energy in the inductor in a further control loop and to actuate the controllable unit so that energy flows from the test device to the test specimen.

24. The method as claimed in claim 20, wherein the test device is configured for generating a test signal for the test specimen and evaluating a test response of the test specimen, and wherein the controller is configured to actuate the controllable unit to store energy in the inductor in response to the test signal.

25. The method as claimed in claim 20, wherein the test device further includes a terminal that is conductively connectable to the test specimen in a non-destructively detachable way, and wherein the energy flows from the test specimen across the terminal to the test device.

26. The method as claimed in claim 20, wherein a check is carried out to determine whether energy stored in the inductor has been sufficiently reduced.

27. The method as claimed in claim 20, wherein the controllable unit is configured to switch into a plurality of control loops, the plurality of control loops including the control loop when energy stored in the inductor is to be reduced, and wherein the controller comprises at least one memory element for each control loop in the plurality of control loops.

28. The method as claimed in claim 27, wherein the controller is configured to reduce the energy to carry out at least one control loop as a power regulator based at least in part on the at least one memory element.

29. The method as claimed in claim 27, wherein the controller comprising a selection logic unit configured to select a control loop from the plurality of control loops based at least in part on the determining whether energy is to be reduced.

30. The method as claimed in claim 20, wherein determining whether energy is to be reduced comprises at least one of:

detect whether an emergency shutoff switch has been actuated;
monitor a user interface of the test device;
detect that the inductor is to be demagnetized; and
monitor a progress of a test procedure.

\* \* \* \* \*